United States Patent [19]

Serlet

[11] Patent Number: 4,792,909
[45] Date of Patent: Dec. 20, 1988

[54] BOOLEAN LOGIC LAYOUT GENERATOR

[75] Inventor: Bertrand P. Serlet, Palo Alto, Calif.

[73] Assignee: Xerox Corporation, Stamford, Conn.

[21] Appl. No.: 848,523

[22] Filed: Apr. 7, 1986

[51] Int. Cl.$^4$ .......................................... H03K 19/20
[52] U.S. Cl. .................................. 364/491; 364/488; 364/490
[58] Field of Search ............... 364/488, 491, 490, 489, 364/715, 716; 307/445, 465, 471

[56] References Cited

U.S. PATENT DOCUMENTS

| | | | |
|---|---|---|---|
| 4,306,286 | 12/1981 | Cooke et al. | 364/488 |
| 4,433,331 | 2/1984 | Kollaritsch | 364/716 |
| 4,541,067 | 9/1985 | Whitaker | 364/716 |
| 4,551,815 | 11/1985 | Moore et al. | 364/716 |
| 4,566,064 | 1/1986 | Whitaker | 364/300 |
| 4,591,993 | 5/1986 | Griffin et al. | 364/491 |
| 4,600,846 | 7/1986 | Burrows | 364/784 |
| 4,622,648 | 11/1986 | Whitaker | 364/784 |

OTHER PUBLICATIONS

Akers, Sheldon, "Binary Decision Diagrams", IEEE Transactions on Computers, vol. C-27, No. 6, Jun. 1978, pp. 509–516.

Bryant, R., "Symbolic Manipulation of Boolean Functions Using a Graphical Representation", Proceedings of the 22nd Design Automation Conf., Jun. 1985, pp. 688–694.

Chen, C. & Otten, R., "Considerations for Implementing CMOS Processors", Proceedings of the IEEE International Conf. on Computer Design, Oct. 1984, pp. 48–53.

Yoffa, E. and Hauge, P., "ACORN: A Local Customization Approach to DCVS Physical Design", Proceedings of the 22nd Design Automation Conf., Jun. 1985, pp. 32–38.

Primary Examiner—Parshotam S. Lall
Assistant Examiner—V. N. Trans

[57] ABSTRACT

To reduce the size of binary decision tree-type integrated circuit representations of boolean expressions, any boolean expression or sub-expression which is fully defined by one of its partial expressions is represented by only that one partial expression. If gate branching of the decision tree is a default case which is invoked only when both partial expressions are needed to define an expression or sub-expression. These reduced size expression trees readily map into CMOS cascade logic, thereby producing low power, reasonably compact, integrated circuit representations of boolean expressions.

6 Claims, 4 Drawing Sheets

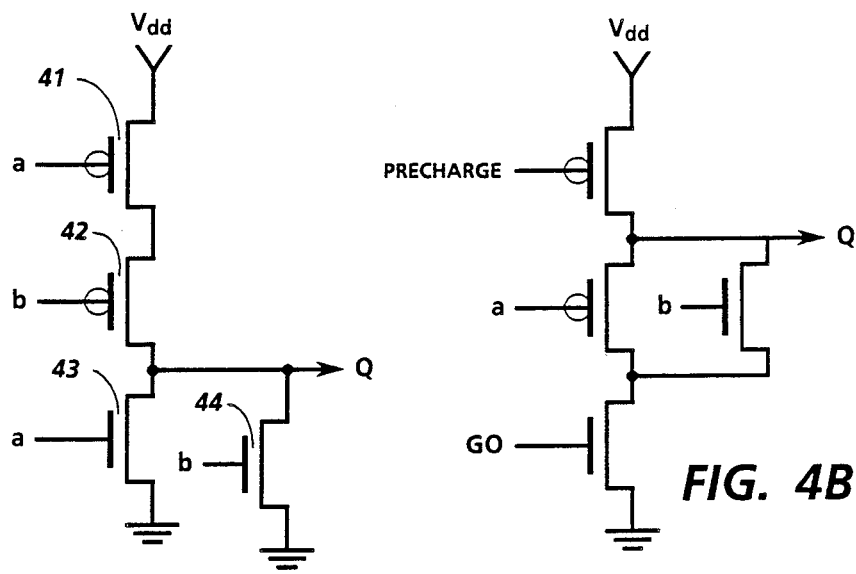
FIG. 4A
FIG. 4B
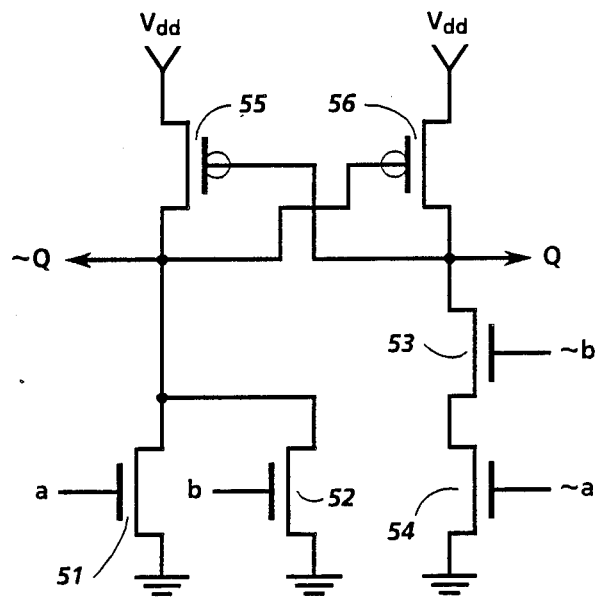
FIG. 4C

BOOLEAN LOGIC LAYOUT GENERATOR

FIELD OF THE INVENTION

This invention relates to boolean logic representations and, more particularly, to layout generators for integrated circuit implementations of boolean expressions.

BACKGROUND OF THE INVENTION

Computer assisted design (CAD) tools have been developed for laying out integrated circuit implementations of boolean expressions. For example, there are CAD tools for disjunctively decomposing boolean expressions into a sum of products form for generating programmable logic array (PLA) very large scale integrated (VLSI) circuit implementations of various functions. As is known, any boolean expression can be decomposed into a sum of products, but the decomposition is unqieu only if each of the products contains all of the variables. Techniques have been developed for minimizing the number of product terms which are required to provide a unique representation, so relatively compact PLAs may be designed to perform tasks ranging from relatively simple counter and decoder functions to far more complex controller and table look-up memory functions. The disjunctive representation of boolean expressions also is utilized to some extent in the design of so-called Weinberger's arrays.

Another known process for decomposing boolean expressions allows any expression of N variables to be represented by two partial functions of N−1 variables, with a boolean choice operator between the partial functions, such that:

$$F[x_1, x_2, \ldots, x_n] = x_1 \cdot F_1[x_2, \ldots, x_n] + \sim x_1 \cdot F_0[x_2, \ldots, x_n] \quad (1)$$

where:
"·" represents the AND (product) operator,
"+" represents the OR (sum) operator, and
"~" represents the NOT (complement or negation) operator An IF operator (i.e., a conceptual multiplexor) for selecting one of two subexpressions can be defined in terms of the AND and OR operators as follows:

$$IF[a,b,c] = a \cdot b + \sim a \cdot c \quad (2)$$

Thus, equation (1) can be rewritten as an IF function:

$$F[x_1, x_2, \ldots, x_n] = IF x_1 \, THEN \, F_1[x_2, \ldots, x_n] \, ELSE \, F_0[x_2, \ldots, x_n] \quad (3)$$

which simplifies to:

$$F[x_1, x_2, \ldots, x_n] = IF\{x_1, F_1[x_2, \ldots, x_n], F_0[x_2, \ldots, x_n]\} \quad (4)$$

Assuming that the variables are ordered, equation (4) may be abbreviated as:

$$F = x \cdot F_1 + \sim x \cdot F_0. \quad (5)$$

This simplified representation is sometimes referred to as a binary decision tree. See, for example, Akers, Sheldon, "Binary Decision Diagrams," *IEEE Transactions on Computers*, Vol. C-27, No. 6, June 1978, pp. 509–516.

Binary decision trees are easy to operate upon, and the composition laws which govern them are straightforward. Heretofore, lower, they have not been widely utilized for laying out integrated circuit (e.g., VLSI) implementations of boolean expressions because the size of the representation which they conventionally yield for an expression containing N variables is $2^N$. As a general rule, size is the most important parameter of a representation because the layout area required for the representation and the computational time required for it to perform its intended function both usually increase as a function of the size of the representation.

SUMMARY OF THE INVENTION

In accordance with the present invention, provision is made for reducing the size of binary decision tree representations of boolean expressions and for mapping such reduced size representations onto two dimensional integrated circuit layouts so that all input variables run in one direction and all expressions and sub-expressions run in an orthogonal direction. To that end, the decision tree partial expressions of a boolean expression and each of its sub-expressions are evaluated to identify special cases which are fully defined by only one of the two partial expressions of the term being evaluated, thereby limiting the use of the IF operator to a default case which is invoked only if both partial expressions are required for a complete definition of the evaluated term.

If the input variables of the boolean expression are ordered, then its binary decision tree decomposition is unique. However, the number of IF operators which are required to faithfully represent the expression may be reduced by permuting the inputs. An exhaustive search of all possible permutations often is impractical, so other techniques may be employed to identify the better permutations. For example, a branch and bound process could be employed, and there also are heuristics which have been developed for permuting two inputs at a time to test the more promising permutations.

The layout generator of the present invention may be employed, for example, to generate CMOS cascode logic for representing boolean expressions, thereby providing low power, static, reasonably compact, integrated circuit representations of such expressions.

BRIEF DESCRIPTION OF THE DRAWINGS

Still other features and advantages of this invention will become apparent when the following detailed description is read in conjunction with the attached drawings, in which:

FIGS. 4A, 4B and 4C schematically illustrate standard CMOS, precharged CMOS, and cascode CMOS combinational circuits, respectively;

DETAILED DESCRIPTION OF THE ILLUSTRATED EMBODIMENTS

While the invention is described in some detail hereinbelow with reference to certain illustrated embodiments, it is to be understood that there is no intent to limit to those embodiments. On the contrary, the aim is to cover all modifications, alternatives and equivalents falling within the spirit and scope of the invention as defined by the appended claims.

Figure 1:
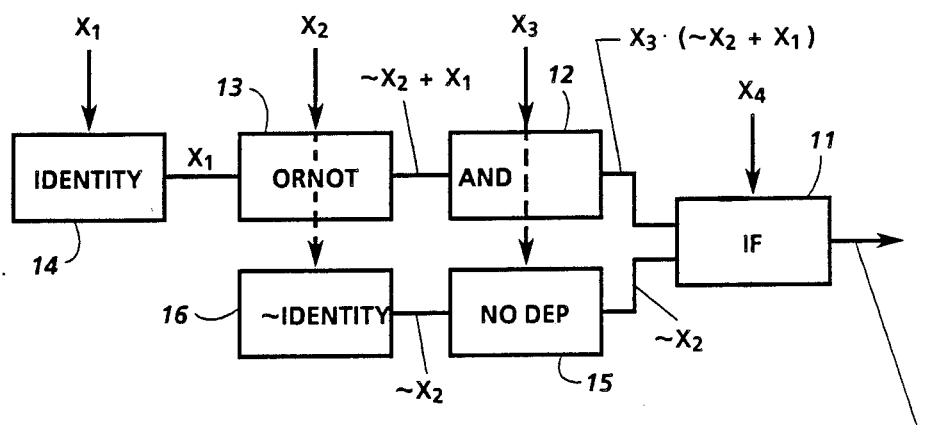
FIG. 1 is a schematic diagram of a binary decision tree representation of a boolean expression which has been evaluated in accordance with the present invention.

Turning now to the drawings, and at this point especially to FIG. 1, there is a binary decision tree representation of a typical boolean expression $$F_A = x_4 \cdot x_3 \cdot (\sim x_2 + x_1) + \sim x_4 \cdot x_2 \tag{6}$$

which comprises four ordered input variables, $x_1 - x_4$. Given the ordering of the inputs $x_1 - x_4$ the branch-by-branch and node-by-node decomposition of the expression $F_A$ into its sub-expressions is unique. It will be seen, however, that the order of the inputs $x_1 - x_4$ may be permuted to determine whether a different order provides a more efficient factorization of the function $F_A$. Moreover, while a dual branch decision tree representation has been shown, it will be understood that the present invention may be applied to generate and layout more complex boolean expressions which may require additional branches.

In accordance with the present invention, provision is made for reducing the size of the binary decision tree representations of boolean expressions, such as the expression $F_A$. To that end, the expression and each of its decomposed sub-expressions (collectively referred to herein as the "boolean terms") are evaluated to determine whether one or both of the partial expressions, $F_1$ and $F_0$, of the term F being evaluated are required to fully define it. A term F is completely defined by just one of its partial expressions $F_1$ or $F_0$ (1) if either of the partial expressions $F_1$ or $F_0$ is true ("1") or false ("0"), or (2) if the partial expressions $F_1$ and $F_0$ are identical or opposite. Thus, for each term of the decomposed expression, eight tests are performed sequentially on its partial expressions, leaving a ninth condition as the default or "ELSE" case:

sion from approximately $2^N$ to approximately N. For example, as shown in FIG. 1, the IF operator 11, the AND operator 12, the ORNOT operator 13, the identity operator 14, the NoDependence Operator 15, and the ~Identity operator 16 result from such an evaluation of the binary expression $F_A$ and of the subexpressions into which it decomposes, such as by an appropriately programmed digital computer (not shown), in this particular case, the size of the representation required (i.e., the number of operators needed) was reduced from fifteen (i.e., $2^N - 1$) to six (i.e., N+2). The composition laws are unaffected by the tests performed to identify the special or non-default cases, so the decomposition of the binary expression $F_A$ is still unique given the ordering of its input $x_1$-$x_4$.

Figure 2A:
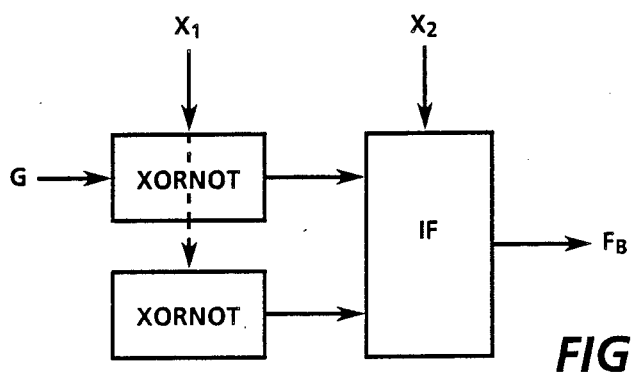
FIGS. 2A and 2B schematically illustrate best case and worst case permutations, respectively, of the input variables for a simple boolean expression.
Figure 2B:
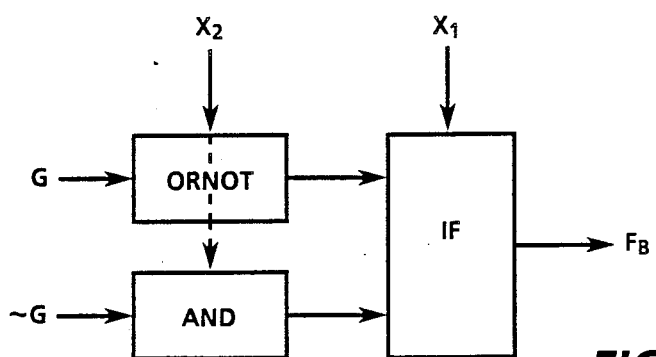

Referring to FIGS. 2A and 2B, the dependence of the binary decision tree decomposition of a boolean expression on the ordering of its inputs will be evident when it is observed that the boolean equation (FIG. 2A):

$$F_B = \mathrm{IF}\{x_2, \mathrm{XORNOT}[x_1, G], x_1\} \tag{7}$$

where G is another expression can be rewritten after permuting its inputs x1 and x2 as (FIG. 2B):

$$F_B = \mathrm{IF}\{x_1, \mathrm{OR}[x_2, G], \mathrm{ANDNOT}[x_2, G]\} \tag{8}$$

Equation (8) duplicates the G expression, so it yields a representation of $F_B$ that exceeds the size of the Equation (7) representation of $F_B$ by a factor equatl to the size of G. Unnecessarily large representations may occur at all levels of the expression tree, thereby provoking a rapid growth of the overall representation. The theoretical answer to the problem of finding the most efficient permutation of the inputs is to perform an exhaustive search and comparison of all possible permutations. As a general rule, however, that is not a practical strategy, so a branch and bound search or the like and/or heuristics may be employed to identify better permutations. Typically, the goal is to reduce the number of IF operators required because they produce the largest representations. The heuristics which have been developed to accomplish that significantly simplify the computational problem because only, two nputs are

| Test<br>Test | Conclusion<br>if True | Operator<br>Indicated | Size (S) of<br>Rep. Req'd |
|---|---|---|---|
| $F_1 = F_0 = 1$ or $0$ | $F = 1$ or $F = 0$ | Constant | 1 |
| $F_1 = \sim F_0 = 1$ or $0$ | $F = x$ or $F = \sim x$ | Identity | 1 |
| $F_1 = 1$ | $F = x + F_0$ | OR | $S(F_0) + 1$ |
| $F_0 = 0$ | $F = x \cdot F_1$ | AND | $S(F_1) + 1$ |
| $F_0 = 1$ | $F = F_1 + \sim x$ | ORNOT | $S(F_1) + 1$ |
| $F_1 = 0$ | $F = \sim x \cdot F_0$ | ANDNOT | $S(F_0) + 1$ |
| $F_1 = F_0$ | $F = F_1$ | NoDependence | $S(F_1)$ |
| $F_1 = \sim F_0$ | $F = x \cdot F_1 + \sim x \sim F_1$ | XORNOT | $S(F_1) + 1$ |
| ELSE | $F = x \cdot F_1 + \sim x \cdot F_0$ | IF | $S(F_1) + S(F_0) + 1$ |

Thus, in view of equation (5), it will be understood that the size of the representation of any expression F containing N variables ranges from 1 to N if any one of the first eight conditions on the above table is satisfied (i.e., tests "true") and $2^N - 1$ only in the default case. Preferably, therefore, the order in which the tests are performed is selected so that the first two of the above listed tests are followed by the next four which, in turn, are followed by the seventh and eighth. Experience has demonstrated that such a term-by-term partial expression evaluation generally reduces the size of the binary decision tree representation of a given boolean exprespermuted at a time, such as by testing neighbors and by attempting to find the best input for each position. Reiterative testing is employed in the attempt to find the best input for each position, starting with final input position (i.e., the one nearest the ultimate output) and working back to the initial input position, thereby causing the process to converge after a few iterations so that locally optimum inputs for each input position are identified.

Figure 3:
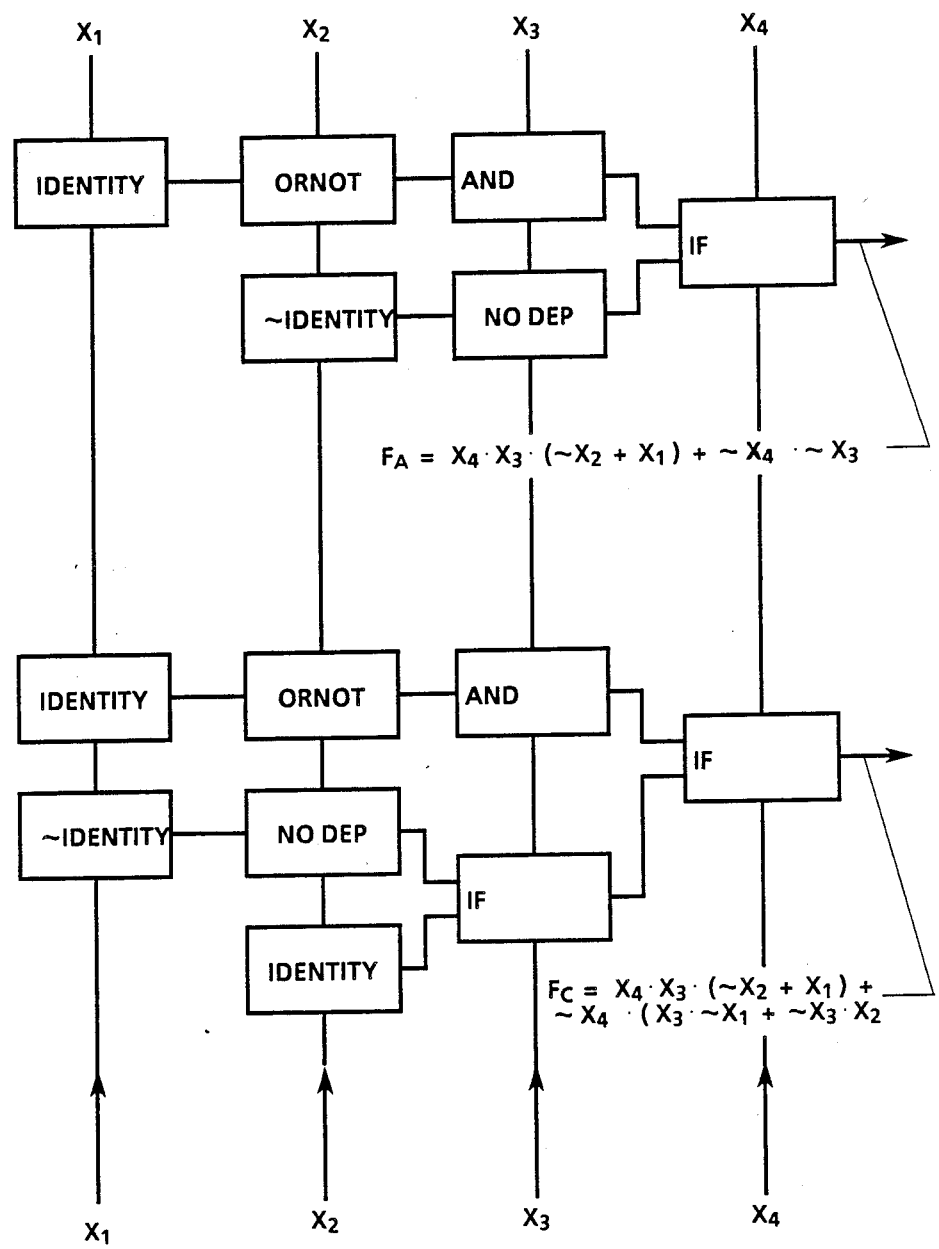
FIG. 3 is a schematic diagram of a layout map generated in accordance with this invention for two boolean expressions based on four input variables.

Turning to FIG. 3, it will be seen that input variables may be shared by the representations for different binary expressions $F_A$ and $F_C$. The expression tree representations of $F_A$ and $F_C$ are each generated using the above described term-by-term evaluative tests, but the representations are laid out so that their input variables $x_1-x_4$ all run in the one direction (vertically, as shown), while the expressions $F_A$ and $F_C$ and their sub-expressions all run in an orthogonal (horizontal) direction. Conceivably, sub-expressions could also be sheared, such as proposed by Bryant, R., "Symbolic Manipulation of Boolean Functions Using a Graphical Representation," *Proceedings of the 22nd Design Automation Conference*, June 1985, pp. 688–694, but it would then be more difficult to map the representations to layout because directed array graphs (DAGs) would have to be mapped, rather than expression trees. The increased compaction that is offered by the sharing of sub-expressions is generally insufficient to warrant sacrificing the straightforward and natural two dimensional mapping of expression trees.

CMOS currently is a favored VLSI circuit technology because of its relatively low power consumption. As more fully described in the published literature, such as by Hodges, D., and Jackson, H., *Analysis and Design of Digital Integrated Circuits*, McGraw Hill, 1983, ISBN 0-07-029153-5, there are four basic types of CMOS combinational circuits: true CMOS (FIG. 4A), precharged CMOS (FIG. 4B), cascode CMOS (FIG. 4C) and psuedo NMOS (not shown). Standard or so-called true CMOS gates, such as shown in FIG. 4A, tend to be relatively large because they have the same number of p-transistors 41 and 42 as n-transistors 43 and 44, such that area occupied by the gate must be expanded to accommodate the wider p-transistors 41 and 42, the necessary separation of them from the n-transistors 43 and 44, and the transistor interconnects. Psuedo-NMOS is a variation in which p-transistors are used to imitate NMOS pull-up transistors. Less area is required for a psuedo-NMOS gate, but that savings is offset by an increased static power consumption and by a slower rise time (i.e., low-to-high transition). Precharged CMOS gates, such as shown in FIG. 4B, require a precharge input for tricklecharging purposes, as well as global clock control signal, $G_o$, for timing control. Thus, care must be taken while designing arrays of such gates to avoid unwanted race conditions. Cascode CMOS combinational logic, such as shown in FIG. 4C, offer the static stability of true CMOS, but requires less area. See, Chen, C. and Otten, R., "Considerations for Implementation CMOS Processors," *Proceedings of the IEEE International Conference on Computer Design*, October 1984, pp. 48–53. Also see, Yoffa, E. and Hauge, P., "ACORN: A Local Customization Approach to DCVS Physical Design," *Proceedings of the 22nd Design Automation Conference*, June 1985, pp. 32–38.

As is known, all signals are carried on dual rails when cascode CMOS is used, so the complement of each input signal is needed and the complement of each output signal is produced. Equation (5) confirms the desireability of this feature for the implementation of binary decision tree representations of boolean expressions. Cascode CMOS combinational circuits include parallel shunt connected n-transistors 51 and 52 and series connected n-transistors 53 and 54. In addition to the pull down chains provided by the n-transistors 51, 52 and 53, 54, two cross coupled p-transistors 55 and 56 are needed to compute the complementary outputs Q and $\sim Q$. Typically, therefore, such combinational logic has been proposed for large and medium size gates (i.e., those which have at least three or four inputs).

Figure 5:
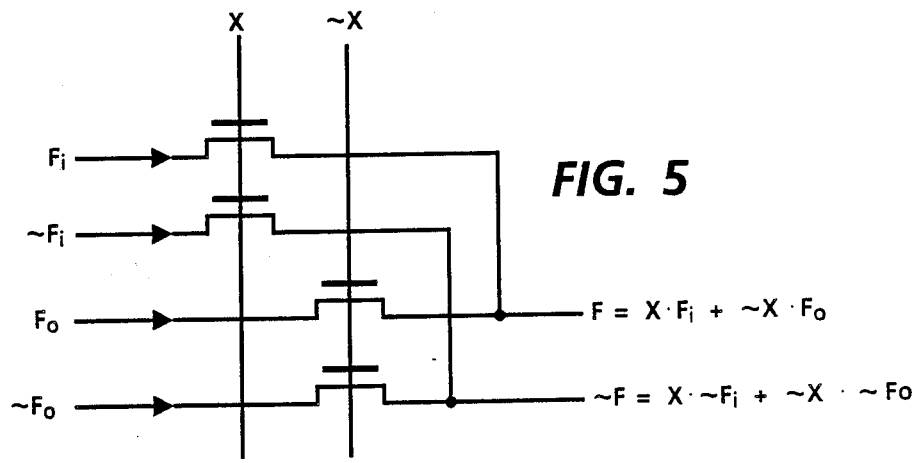
FIG. 5 schematically illustrates a CMOS cascode pull down IF cell.

In accordance with one of the more detailed features of this invention, provision is made for grouping elemental CMOS cascode logic gates to minimize the number of transistors required per gate. To permit such grouping, logic values of expressions and sub-expressions are mapped to voltage levels using the rule that a logical true value ("1") means pulled down to ground via a n-transistor and a logical false value ("0") means not pulled down to ground As shown in FIG. 5, an IF gate 61 requires two n-transistors 62 and 63 for computing the function:

$$F = x \cdot F_1 + \sim x \cdot F_0 \qquad (9)$$

and two additional n-transistors 64 and 65 for computing the function:

$$\sim F = x \cdot \sim F_1 + \sim x \cdot F_0 \qquad (10)$$

Figure 6:
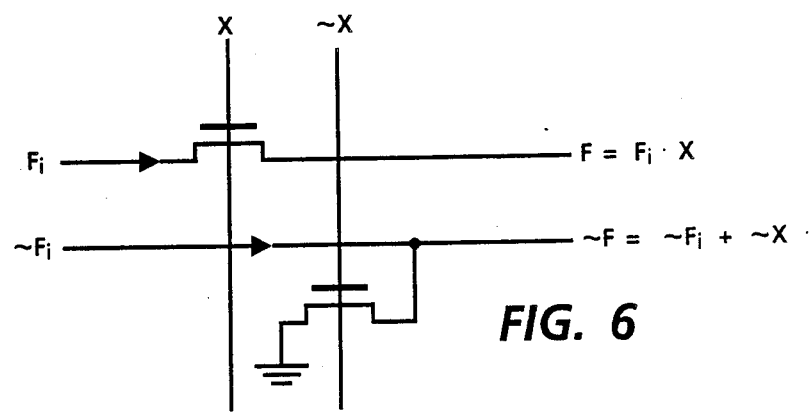
FIG. 6 schematically illustrates a CMOS cascode pull down AND cell.

Referring to FIG. 6, however, it will be seen that the AND gate 71 can be implemented using only two n-transistors 72 and 73 because the function:

$$\sim F = \sim F_1 + \sim x \qquad (11)$$

can be rewritten as:

$$F = F_1 \cdot x \qquad (12)$$

Similarly, only two n-transistors are required for each ANDNOT, OR and ORNOT gate.

Figure 7:
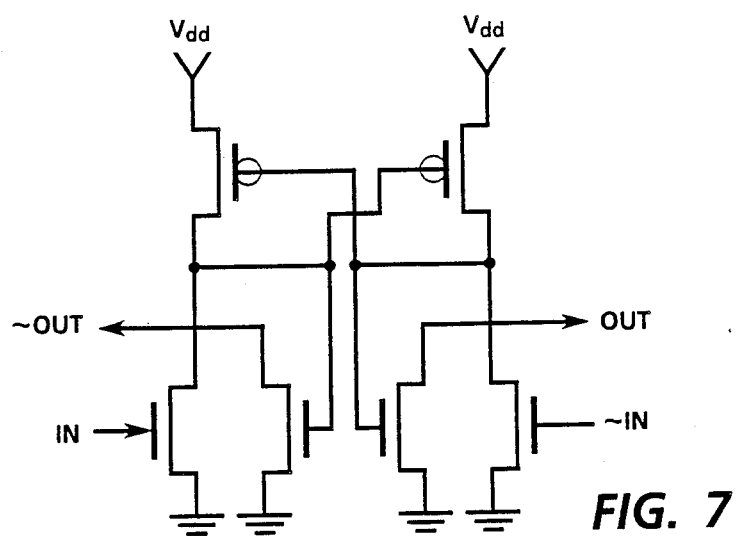
FIG. 7 schematically illustrates a CMOS cascode repeater cell.

Long pull down chains of series connected n-transistors introduce undesireable quadratic rise time and fall time delays into the low-to-high and high-to-low transitions of the signals that are produced. For that reason, repeater amplifiers, such as shown in FIG. 7 at 81, are inserted into each branch of the expression tree at regular intervals, such after every five or six gates. As illustrated, the repeater amplifier 81 comprises a pair of n-transistors 82 and 83 which have their gates connected to receive the complementary signals (in) and $\sim$(in) from a pull down chain (not shown). The transistors 82 and 83 are pull down transistors for a pair of cross coupled p-type pull up transistors 84 and 85 which, in turn, are coupled to the gates of another pair of n-type pull down transistors 86 and 87. The pull down transistors 86 and 87, therefore, regenerate the signals (in) and $\sim$(in), respectively, to produce corresponding complementary output signals (out) and $\sim$(out). The regenerated output signals (out) and $\sim$(out) have brief, sharp transitions, so the computational delay essentially is a linear function of the number of inputs required by the expression tree.

CONCLUSION

In view of the foregoing, it will be understood that the present invention, significantly reduces the size of binary decision tree representations of boolean expressions and enables such reduced size representations to be efficiently mapped into two dimensional integrated circuit layouts.

What is claimed:

1. A method for reducing the size of binary decision tree representations of boolean expressions on integrated circuits having ordered inputs, said method comprising the steps of:

decomposing each boolean expression into its subexpressions based on the ordering of said inputs, such that each term of said decomposed expression introduces a respective one of said inputs;

factoring the input introduced by each term of said decomposed expression and the complement of that input from said term, whereby each term is converted into a pair of partial functions such that $$F = x \cdot F_1 + \sim x \cdot F_0$$

where:

F = any given term of the decomposed expression,
x = the input introduced by said given term, and
$F_1$ and $F_0$ = the partial expressions of said given term;

testing the partial functions of each term of said decomposed expression to determine which of the following conditions is true:

| Test | Conclusion if True | Operator Indicated |
|---|---|---|
| $F_1 = F_0 = 1$ or 0 | $F = 1$ or $F = 0$ | Constant |
| $F_1 = \sim F_0 = 1$ or 0 | $F = x$ or $F = \sim x$ | Identity |
| $F_1 = 1$ | $F = x + F_0$ | OR |
| $F_0 = 0$ | $F = x F_1$ | AND |
| $F_0 = 1$ | $F = F_1 + \sim x$ | ORNOT |
| $F_1 = 0$ | $F = \sim x F_0$ | ANDNOT |
| $F_1 = F_0$ | $F = F_1$ | NoDependence |
| $F_1 = \sim F_0$ | $F = x F_1 + \sim x \sim F_1$ | XORNOT |

-continued

| Test | Conclusion if True | Operator Indicated |
|---|---|---|
| ELSE | $F = x F_1 + \sim x F_0$ | IF | selecting the operator required for each term of said decomposed expression based on the condition found to be true; and laying out said integrated circuit to provide the operator required for each term of said decomposed expression.

2. The method of claim 1 wherein said inputs are laid out on said integrated circuit to run in one direction and said expressions and subexpressions are laid out to run in an orthogonal direction.

3. The method of claim 1 wherein
said integrated circuit is CMOS cascode combinational logic having pull down transistor chains, and
further including the steps of mapping said expressions and sub-expressions to logic voltage levels so that the true values of said expressions and sub-expressions correspond to ground voltage, and grouping said operators in said pull down transistor chains.

4. The method of claim 3 further including the step of distributing cascode signal regenerating repeaters at periodic intervals along said pull down chains.

5. The method of claim 1 wherein said tests are performed sequentially in substantially the order listed.

6. The method of claim 1 further including the step of permuting said inputs to reduce the number of IF operators required.

* * * * *